United States Patent [19]

Mullendore

[11] Patent Number: 4,929,468
[45] Date of Patent: May 29, 1990

[54] FORMATION OF AMORPHOUS METAL ALLOYS BY CHEMICAL VAPOR DEPOSITION

[75] Inventor: Arthur W. Mullendore, Sandia Park, N. Mex.

[73] Assignee: The United States of America as represented by the United States Department of Energy, Washington, D.C.

[21] Appl. No.: 170,228

[22] Filed: Mar. 18, 1988

[51] Int. Cl.[5] .......................... B05D 3/14; C23C 16/18
[52] U.S. Cl. ...................................... 427/47; 427/252; 427/255.2
[58] Field of Search ........................ 427/47, 252, 255.2

[56] References Cited

U.S. PATENT DOCUMENTS

| 3,050,417 | 8/1962 | Nack et al. | 427/252 |
| 3,083,550 | 4/1963 | Averbach | 427/252 |
| 3,355,318 | 11/1967 | Jenkin | 427/252 |
| 3,900,585 | 8/1975 | Matsubara | 427/13 |
| 4,144,585 | 3/1979 | Puchalska-Hibner | 427/47 |
| 4,626,448 | 12/1986 | Hays | 427/39 |

OTHER PUBLICATIONS

D. Wroge & D. Hess, "Plasma-Enhanced Deposition of Iron/Iron Oxide Films", Report LBL-9879, 1979, pp. 30-37.
M. Skibo & F. Greulich, "Characterization of Chemically Vapor Deposited NI-(0.05-0.20 wt. %)B Alloys", Thin Solid Films, vol. 113, 1984, pp. 225-234.
W. Fields, R. Duncan & J. Zickgraf, "Electroless Nickel Plating", Metals Handbook, 9th Edition, ASM, vol. 5, pp. 219-243.
H. Jones, "The Status of Rapid Solidification of Alloys in Research and Application", Journal of Materials Science, vol. 19, 1984, pp. 1043-1076.
H. Leamy & A. Dirks, "The Microstructure of Amorphous Rare-Earth/Transition-Metal Thin Films", Journal of Physics D: Applied Physics, vol. 10, 1977, pp. L95-L98.

Primary Examiner—Sadie Childs
Attorney, Agent, or Firm—Armand McMillan; James H. Chafin; Judson R. Hightower

[57] ABSTRACT

Amorphous alloys are deposited by a process of thermal dissociation of mixtures or organometallic compounds and metalloid hydrides, e.g., transition metal carbonyl such as nickel carbonyl, and diborane. Various sizes and shapes of deposits can be achieved, including near-net-shape free standing articles, multilayer deposits, and the like. Manipulation or absence of a magnetic field affects the nature and the structure of the deposit.

14 Claims, 1 Drawing Sheet

FORMATION OF AMORPHOUS METAL ALLOYS BY CHEMICAL VAPOR DEPOSITION

The U.S. Government has rights in this invention pursuant to Contract No. DE-AC04-76DP00789 between the U.S. Department of Energy and AT&T Technologies, Inc.

BACKGROUND OF THE INVENTION

The present invention relates to amorphous metal alloys. More particularly, it relates to a novel technique for producing a variety of amorphous metal alloys.

Amorphous metal alloys have been studied extensively in the past two decades and have been found to possess a number of superior chemical and physical properties. Among these are excellent corrosion resistance, desirable magnetic properties, and good wear and abrasion resistance.

Heretofore, such alloys have been prepared by several techniques, the most widely used of which being the rapid quenching of the alloy from its melt. While it is possible to produce a variety of different alloys in thin ribbon or wire form in that manner, the technique has inherent limits in the thickness of the stock it can produce and cannot be used to form irregular shapes. Sputtering and plasma deposition have also been used to produce thin foils. As disclosed by A. K. Hayes in U.S. Pat. No. 4,626,448, the latter technique, in particular, has been capable of producing thin adherent coatings of amorphous alloys on relatively large, complex shapes. Both these techniques again are limited in terms of the thickness of deposit that can be formed within a reasonable time without the creation of destructive residual stresses. Electroless nickel plating has also been used to produce a small number of nickel-based amorphous alloys. While the technique has the capability of building thicker deposits, it is rather limited in the variety of alloys that it can produce and does not allow variation of composition and properties during the course of deposition.

An electron beam evaporation process has been disclosed by K. Matsubara in U.S. Pat. No. 3,900,585 for coating a solid metal onto a substrate. However, in that activated evaporation process which utilizes a plasma, the substrate must serve as cathode and, therefore, must be conductive and the resulting coatings are not amorphous. Iron can also be coated onto a substrate by a plasma-enhanced deposition method involving iron pentacarbonyl in a radio-frequency power-induced glow discharge reactor, but again the resulting coating consists of iron crystallites embedded in an iron oxide matrix (D. M. Wroge and D. W. Hess, "Plasma-enhanced Deposition of Iron/Iron Oxide Films", Report LBL-9879, 1979).

Vapor forming of crystalline nickel is a chemical vapor deposition process that has been employed commercially to form near-net-shape objects such as molds and dies. It deposits nickel metal from nickel carbonyl at a fairly rapid rate (about 200 $\mu$m thickness per hour) at moderate temperatures, i.e., about 170° C. It is used to reproduce complex shapes and is virtually unlimited in the thickness of the deposits that it can yield. Deposition of low boron Ni-B alloys, e.g., 0.07 wt% boron (0.38 at.%), has been disclosed by W. C. Jenkin in U.S. Pat. No. 3,355,318. Throughout this application "at.%" stands for "atom%" Skibo and Gruelich also have studied the structure and mechanical properties of chemical vapor deposition (CVD) alloys with boron contents from 0.23 to 1.09 at.% [Thin Solid Films, Vol. 113 (1984) 225]. The chemical vapor deposition process, however, has not been considered suitable so far for the forming of amorphous metal alloys.

In view of the prior art and its limitations, it is an object of this invention to provide a novel technique to produce amorphous metal alloys. Another object is to produce useful stock shapes of amorphous metal alloys such as sheets, tapes, rods, tubing, and the like. A further object is to produce amorphous metal alloys as thick free-standing structures of simple or complex design. A still further object is to provide a technique that can be varied easily and inexpensively to produce metal alloys which are layered or which are graded to other compositions that are either amorphous or crystalline. An additional object is to apply thick coatings to other materials, including infiltration of porous materials, such as cloths, felts, or foams.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the invention, amorphous metal alloys are formed by thermal decomposition of gaseous organometallic compounds and gaseous metalloid hydrides, such decomposition being carried out at a temperature within the range of about 20 to 500° C. and lower than the crystallization temperature of the alloy deposited by the process.

DETAILED DESCRIPTION OF THE INVENTION

Figure 1:
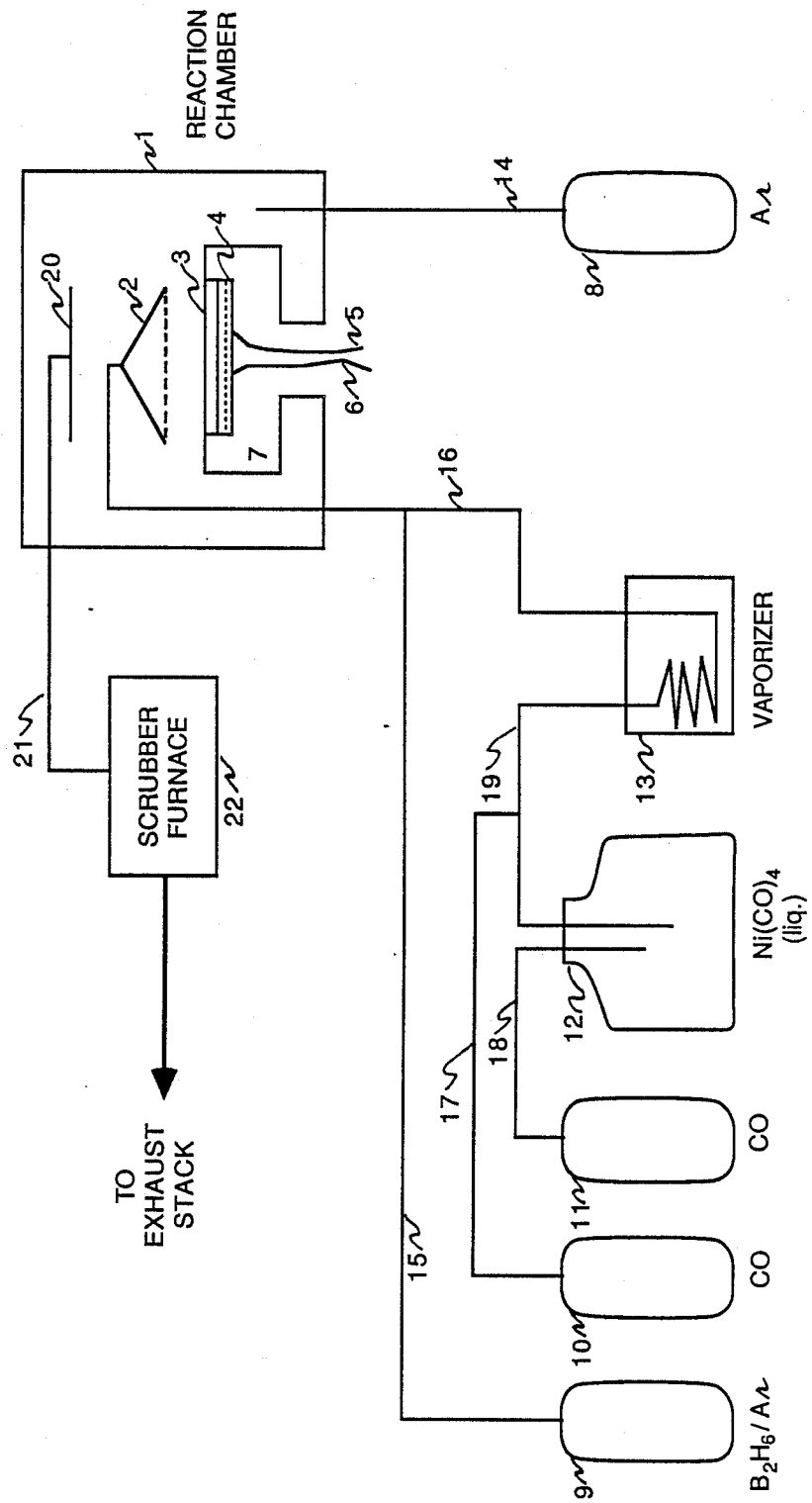
FIG. 1 shows, in schematic representation, a type of apparatus that can be used to carry out the chemical vapor deposition process of the invention which, in this instance, results in the deposition of metastable nickel-boron alloy.

The chemical vapor deposition technique (CVD) employed to fulfill the objectives of the invention uses selected sources gases in conditions conducive to their thermal decomposition. It involves decomposition and/or reaction of the constituents of a gas mixture at or near a heated surface to produce a desired solid deposit on that surface, as well as gaseous by-products. When the method is used to produce thick free-standing deposits, the process is termed "vapor forming". The process is carried with the gases at pressures below, above, or equal to atmospheric pressure. The temperature of the substrate that is required for a given assortment of gases is determined by the temperature dependent chemical equilibrium of that particular gas mixture and the resulting deposit, and by the kinetics of the reactions leading to that equilibrium.

In the present application of the CVD technique, suitable source gases or vapors include: carbonyls of the transition metals iron, nickel, chromium, cobalt, molybdenum, and tungsten; 1,3-dicarbonyl compounds, such as nickel acetylacetonate; metal alkyls; metal alkoxides; metallocenes; and hydrides of the metalloids, e.g., boron, phosphorus, silicon, antimony, and arsenic. When a carbon source is needed, gases such as acetylene can be included in the reaction mixture. One or more of each class of materials, metal compounds and hydrides, can be used in a given preparation. Inert gases or other non-oxidizing gases such as nitrogen, argon, carbon monoxide, hydrogen, and the like can also be used as diluents for the reaction mixture or as active participants in the reaction equilibria involved.

In order to produce thick, amorphous deposits, the gas constituents must decompose at a suitable rate at a temperature lower that the crystallization temperature of the deposited amorphous alloy. The deposition temperature must also be low enough to preclude nucleation of the equilibrium metallic compounds. This has been found to be possible and, under such circumstances, a single, homogeneous, metastable solid phase will be deposited. This phase can be either (1) a supersaturated crystalline solid solution of the constituents, (2) the amorphous metal alloy, (3) a stable intermetallic compound, or (4) a metastable intermetallic compound. Of these possibilities, the phase with the lower Gibbs free energy of formation will be the one that is deposited. For instance, in the Ni-B system, the crystalline phase will be the one that has the lower free energy of formation at low concentrations of metalloid, while, at higher concentration of metalloid, the amorphous alloy may have the lower free energy of formation and, if that is the case, it will be deposited. Which of the two phases has the lower free energy of formation also depends on the deposition temperature. In any event, amorphous alloys containing from about 14 to 40 at.% boron have been obtained from the nickel carbonyl-borane system, while the amorphous alloys obtained from the nickel carbonyl-phosphine system were restricted to about 24 to 26 at.% boron. In the case where an alloy is ferromagnetic at the deposition temperature, the free energies of formation may be influenced by the presence or absence of a magnetic field.

The alloys can be deposited on a wide variety of metallic or nonmetallic substrates and the deposit will replicate the surface of deposition with great fidelity. However, in nickel-based systems, the deposit will not generally form a metallurgical bond to the substrate and thus can be stripped from said substrate with ease. For the replication of irregularly shaped objects, the substrate chosen will be one that can be removed by selective chemical attack or by melting. In other instances, e.g., for the formation of composite structures by deposition onto a porous substrate such as a cloth, a felt, or a foam, the substrate becomes an integral part of the finished structure and is thus not removed.

The process of the invention is easily amenable to the production of layered structures of differing compositions and properties by altering inlet gas composition and mixture, substrate temperature, and magnetic field.

An apparatus of the type that can be used to carry out the the process of the invention, in this particular instance the formation of a nickel-boron amorphous alloy, is illustrated schematically in FIG. 1. In a typical run, substrate 3, in this case a flat plate of copper, is placed on hot plate 4 provided with electrical connectors 5 and 6 and located in insulation block 7. The reactor chamber 1 is then closed, evacuated, and is swept with argon brought in from reservoir 8 through conduit 14, and then out of the apparatus through exhaust port 20, conduit 21, scrubber furnace 22, and ultimately through an exhaust stack (not shown).

After the chamber has thus been made ready, the reactive gases or vapors are introduced into it through conduit 16 and diffuser 2. The boron compound used in this illustrative run is supplied as a mixture of diborane and argon from reservoir 9 through conduit 15. The nickel compound, on the other hand, is liquid nickel carbonyl, supplied from reservoir 12 through conduit 19 and vaporizer 13. Carbon monoxide from reservoirs 10 and 11 is used to flush out the liquid nickel carbonyl from reservoir 12 and to entrain it to vaporizer 13.

The substrate temperature is set at the desired level and the reactive gases or vapors are maintained at the proper partial pressure until the deposition of alloy is complete.

Although five reservoirs are shown in the drawing, the manifold-reservoir arrangement can be altered to accommodate three or more gas or vapor sources, depending on the nature of the alloy that is ultimately desired.

Due to the toxicity of some of the gases or vapors employed and produced during the deposition, scrubber furnace 22 is provided downstream of reaction chamber 1 and said toxic materials are drawn though outlet 20 and conduit 21 to be decomposed thermally and/or scrubbed out of the system's effluent before evacuation through an exhaust stack.

While it is obvious that several other elements of the apparatus described are necessary for the conduct of the process disclosed, such elements are not shown since their presence would only distract from a quick understanding of the drawing. Among these elements are a vacuum pump, shut-off valves, needle valves, gas regulators, liquid flow meters, and gas flow meters.

The deposition process of this invention can be controlled by varying the number and nature of gas or vapor sources, their concentrations and proportions in the reaction mixture, their rate of feeding into the reaction chamber, and the order of admission into said chamber. Other factors involved include the nature of the substrate used, the temperature of said substrate during the deposition reaction, and, in cases where a magnetic product is formed, the magnetic field existing at the deposition site. By controlling these factors, homogeneous deposits and shapes or structures consisting of layers of different materials can be made.

The following examples will serve to illustrate the invention in greater operational detail and are not to be construed as limitations of the invention beyond the scope of the appended claims. Some deposition examples, which do not constitute embodiments of the invention are also provided for comparison purposes.

EXAMPLES

Various deposits of materials were obtained using the apparatus just described. In these preparations, the gases were kept at nearly atmospheric pressure (650 torr) and the substrate temperature was varied between 130 and 200° C. The net inlet gas contained $Ni(CO)_4$, $B_2H_6$, CO, and Ar. It flowed through the diffuser, then over a copper substrate resting on an AC (60 Hz) resistance heated plate. Two gas mixtures (expressed as flow rates of the constituents, in standard cubic centimeters per minute, or sccm) were used:

(1) a high nickel mixture: $Ni(CO)_4$, 160 sccm; $B_2H_6$, 70 sccm; CO, 35 sccm; Ar, 415 sccm; and (2) a high boron mixture: Ni(CO)$_4$, 130 sccm; B$_2$H$_6$, 130 sccm; CO, 28 sccm; Ar, 485 sccm.

The following results were obtained:

| Example | Mixture | Substrate Temperature | Other conditions | Deposit |
|---|---|---|---|---|
| 1 | high Ni | 155° C. | — | metastable crystal-solid solution of Ni$_{87}$B$_{13}$ |
| 2 | high B | 145° C. | — | amorphous structure of Ni$_{63}$B$_{37}$ |
| 3 | high Ni | 165° C. | substrate shielded from hot plate magnetic field* deposition rate: 20 μm/hour | amorphous structure of Ni$_{60}$B$_{40}$ |

*by mumetal, a high magnetic permeability alloy Fe (16.5), Ni (76), Cu (6), and Cr (1.5 wt %).

The amorphous alloy of Example 3 had a diamond-pyramid hardness of 610 kg/mm$^2$ (200 g load). It contained a typical 1 at.% oxygen and 0.5 to 1 at.% C as the major impurities. The amorphous alloy, unlike the crystalline alloy, is resistant to a concentrated acid such as 30% HNO$_3$ in methanol, a standard electrolytic etch. The crystallization temperature of the amorphous material was determined to be 500° C. for a heating rate of 20° C./min.

Friction and wear tests were made using the pin-on-disc configuration. The pins had hemispheral ends 1.59 mm diameter which were machined to an r.m.s. surface finish of 0.04 μm. A new pin was used for each test. The discs were polished to an r.m.s. surface finish of 0.05 μm. Friction forces were measured using a ten-pound load cell with linearity within 0.15%. The load cell output and thus the friction coefficient were measured continuously. Each test consisted of 1000 revolutions at 50 rev min$^{-1}$ in air. Normal load from 25 to 600 g were used. The sliding speed was about 40 mm s$^{-1}$. No lubricants were used. At the completion of 1000 revolutions, scanning electron microscope (SEM) micrographs were taken of the pin wear scars and the disc wear tracks, and the roughness of the disc was measured with a profilometer.

As determined by this test, the 37.4 at.% boron amorphous alloy of Example 3 showed a wear track depth of <0.05 μm, a wear track width of 390 μm, and a pin wear depth of 23 μm with a 200 g load. In contrast, a 1.9 at.% boron crystalline alloy showed a wear track depth of 3.4 μm, a wear track width of 450 μm, and a pin wear depth of 28 μm under the same test conditions. Friction coefficients after 1000 cycles were determined to be 0.94 and 0.72, respectively. More details about these tests are provided by A. W. Mullendore and L. E. Pope in "Wear Resistance of Metastable Ni-B Alloys Produced by Chemical Vapor Deposition", Thin Solid Films, 153 (1987) 267-269. This article is incorporated herein by reference.

EXAMPLE 4

A gas mixture of the following composition was used to form an amorphous ternary nickel-chromium-phosphorus alloy by the CVD method:

| | |
|---|---|
| Ni(CO)$_4$ | 7.72 sccm |
| Cr(CO)$_6$ | 1.84 sccm |
| PH$_3$ | 1.3 sccm |
| CO | 11.0 sccm |
| Ar | 1010 sccm |

The gas mixture was allowed to flow, at 630 torr, over a heated copper substrate at 225° C. for 2 hours. The magnetic field at the substrate was essentially zero. Although the chromium carbonyl is a solid material, it has, like several other materials in its class, sufficient vapor pressure to be used in a CVD system. In this preparation, the carbonyl container was place in an oil bath, kept at a temperature of about 60° C., and the vapors released were entrained into the reaction chamber by argon. A fully amorphous deposit was produced with a mass thickness of 5.4 mg/cm$^2$ and a composition of 84 wt% nickel, 6.2 wt% Cr, and 9.7 wt% P. This alloy exhibited a rate of corrosion only one tenth that of a crystalline Ni-6 wt% Cr alloy in an acid environment (0.2 N H$_2$SO$_4$).

EXAMPLE 5

The gas mixture used in this example has the following composition:

| | |
|---|---|
| Ni(CO)$_4$ | 8.33 sccm |
| Cr(CO)$_6$ | 1.79 sccm |
| PH$_3$ | 1.3 sccm |
| CO | 18.3 sccm |
| Ar | 1010 sccm |

The reaction was carried in the manner of Example 4, except that a substrate temperature of 235° C. was employed. The amorphous alloy deposit obtained has a mass thickness of 5.6 mg/cm$^2$ and a composition of 77 wt% nickel, 11.3 wt% chromium, and 11 wt% phosphorus. The presence or absence of a magnetic field did not influence the weight of material deposited, its structure, nor its composition. This amorphous alloy exhibited a rate of corrosion that was only one hundredth that of a crystalline Ni-6wt% Cr in a 0.2 N H$_2$SO$_4$ environment.

EXAMPLE 6

The gas mixture used in this experiment had the following composition:

| | |
|---|---|
| Ni(CO)$_4$ | 39.4 sccm |
| PH$_3$ | 9.0 sccm |
| CO | 5.1 sccm |
| Ar | 73.0 sccm |

The mixture was allowed to flow, at about 650 torr, over a copper heated substrate at 170° C. for 40 minutes in a magnetic field of approximately 6 gauss. The deposit obtained was 16 μm thick. Its composition was 24.7 at.% P and 75.3 at.% Ni and it had a face-centered-cubic crystalline nickel structure, with the phosphorus in supersaturated solid solution.

EXAMPLE 7

Another mixture of:

| | |
|---|---|
| Ni(CO)$_4$ | 49.2 sccm |
| PH$_3$ | 4.5 sccm |
| CO | 4.9 sccm |
| Ar | 57.5 sccm | was used in the same manner as that of Example 6, except that the flow lasted 41 minutes and, more importantly, in the absence of a magnetic field. The deposit obtained was 11 μm thick. Its composition was 24.8 at.% P and 75.2 at.% nickel, and its structure was amorphous as revealed by X-ray diffraction.

In these last two runs, the reaction conditions were nearly identical and the difference in type of material obtained can clearly be ascribed to the presence or absence of a magnetic field. When a magnetic field exists, a crystalline alloy is obtained, and when there is not any magnetic field, an amorphous alloy is obtained.

The preceding examples can be repeated with similar results by substituting the generically or specifically described reactants listed earlier and by altering operating conditions to suit the materials used. In this manner, there can be produced many different types of coatings on a variety of shapes and configurations and, in addition, it has now become possible to fabricate near-net-shape structures made of amorphous alloys, without having to resort to expensive machining. Thus, in addition to the production of coatings on all kinds of substrates and the impregnation of porous bodies, the hard, wear-resistant amorphous alloys can be formed into molds, dies, and other useful articles such as sheets, tapes, rods, tubing, and the like.

From the foregoing description, one skilled in the art can easily ascertain the essential characteristics of the present invention and, without departing from its spirit and scope, can make various changes and modifications to adapt it to different usages and conditions.

What is claimed is:

1. A method of forming amorphous alloy deposite on heated surfaces by thermal dissociation of various mixtures of organometallic compounds, and metalloid hydrides in a neutral or reducing diluent gas atmosphere at temperatures ranging from about 20 to about 500° C., wherein the temperature selected for the dissociation is lower than the crystallization temperature of the alloy produced.

2. The method of claim 1, wherein the organometallic component of the mixture is selected from the group consisting of carbonyls of the transition metals, metal alkyls, metal alkoxides, metallocenes, and mixtures thereof.

3. The method of claim 2, wherein the organometallic component of the mixture is a carbonyl compound of nickel, iron, chromium, molybenum, tungsten, cobalt, or mixtures thereof.

4. The method of claim 1, wherein the hydride component of the mixture is selected from the group consisting of hydrides of boron, phosphorus, arsenic, silicon, and mixtures thereof.

5. The method of claim 1, wherein the reaction mixture contains an inert gas, carbon monoxide, hydrogen, or a mixture thereof.

6. The method of claim 1, wherein the reaction mixture contains nickel carbonyl and diborane at partial pressures sufficient to yield an amorphous alloy containing from about 14 to 40 atom boron.

7. The method of claim 1, wherein the reaction mixture contains nickel carbonyl and phosphine at partial pressures sufficient to yield an amorphous alloy containing from about 24 to 26 atom phosphorus.

8. The method of claim 7, wherein the reaction mixtures also contains vapors of chromium carbonyl.

9. The method of claim 1, wherein the composition of the reaction mixture is varied during the course of the reaction.

10. The method of claim 6, wherein a feed reaction mixture consisting of 160 sccm nickel carbonyl, 70 sccm borane, 35 sccm carbon monoxide, and 415 sccm argon, and a temperature of 165° C. are maintained in the absence of a magnetic field.

11. The method of claim 6, wherein a feed reaction mixture consisting of 130 sccm nickel carbonyl, 130 sccm borane, 28 sccm carbon monoxide, and 485 sccm argon, and a temperature of 145° C. are maintained.

12. The method of claim 7, wherein a feed reaction mixture consisting of 49.2 sccm nickel carbonyl, 4.5 sccm phosphine, 4.9 sccm carbon monoxide, and 57.5 sccm argon, and a temperature of 170° C. are maintained in the absence of a magnetic field.

13. The method of claim 8, wherein a feed reaction mixture consisting of 7.72 sccm nickel carbonyl, 1.84 sccm chromium carbonyl, 1.3 sccm phosphine, about 11.0 carbon monoxide, and 1010 sccm argon, and a temperature of 225° C. are maintained.

14. The method of claim 8, wherein a feed reaction mixture consisting of 8.33 sccm nickel carbonyl, 1.79 sccm chromium carbonyl, 1.3 sccm phosphine, about 18.3 carbon monoxide, and 1010 sccm argon, and a temperature of 235° C. are maintained.

* * * * *